United States Patent
Wada et al.

(10) Patent No.: US 9,362,152 B2
(45) Date of Patent: Jun. 7, 2016

(54) ARTICLE SUPPORTING DEVICE

(71) Applicant: Daifuku Co., Ltd., Osaka (JP)

(72) Inventors: Yoshinari Wada, Shiga (JP); Tomotaka Kinugawa, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 14/639,510

(22) Filed: Mar. 5, 2015

(65) Prior Publication Data
US 2015/0255318 A1    Sep. 10, 2015

(30) Foreign Application Priority Data

Mar. 7, 2014  (JP) ................ 2014-045125

(51) Int. Cl.
| | | |
|---|---|---|
| H01L 21/673 | (2006.01) | |
| H01L 21/677 | (2006.01) | |
| B25J 15/00 | (2006.01) | |
| B66C 13/18 | (2006.01) | |
| B66C 19/00 | (2006.01) | |
| H01L 21/67 | (2006.01) | |

(52) U.S. Cl.
CPC ....... *H01L 21/67326* (2013.01); *B25J 15/0033* (2013.01); *B66C 13/18* (2013.01); *B66C 19/00* (2013.01); *H01L 21/67265* (2013.01); *H01L 21/67379* (2013.01); *H01L 21/67733* (2013.01); *H01L 21/67736* (2013.01)

(58) Field of Classification Search
CPC .. B25J 13/088; B25J 15/0033; B25J 15/0253; B25J 15/026; B25J 19/02; B25J 19/021; B66C 1/28; B66C 13/18; B66C 19/00; B65G 47/901; H01L 21/67326; H01L 21/67265; H01L 21/67379; H01L 21/67733; H01L 21/67736; H01L 21/67766

USPC ................. 294/2, 119.1, 213, 86.4, 902, 907; 414/626, 940; 901/39
See application file for complete search history.

(56) References Cited

U.S. PATENT DOCUMENTS

| | | | | |
|---|---|---|---|---|
| 6,099,059 | A * | 8/2000 | Schultz ................. | B65G 47/90 294/119.1 |
| 6,592,324 | B2 * | 7/2003 | Downs ................. | B25J 15/0253 294/104 |
| 7,464,823 | B2 * | 12/2008 | Nakao .................... | B66C 13/06 212/274 |
| 8,226,140 | B1 * | 7/2012 | Dietrich ................. | B66C 1/107 294/119.1 |
| 8,579,128 | B2 * | 11/2013 | Kawabata ................ | B66C 1/28 212/327 |
| 8,696,042 | B2 * | 4/2014 | Rebstock .......... | H01L 21/67017 294/119.1 |
| 8,752,873 | B2 * | 6/2014 | Hajrovic .............. | B25J 15/0033 294/115 |
| 2012/0034058 | A1 * | 2/2012 | Jin ........................... | B25J 9/041 414/591 |

FOREIGN PATENT DOCUMENTS

JP        2003171081 A     6/2003

* cited by examiner

*Primary Examiner* — Dean Kramer
(74) *Attorney, Agent, or Firm* — The Webb Law Firm

(57) ABSTRACT

Each of a pair of support members includes a lightweight-article support portion that is inserted into an insertion space of a lightweight article and supports a support-target portion of the lightweight article from below and a heavyweight-article support portion that is inserted into an insertion space of a heavyweight article and supports a support-target portion of the heavyweight article from below. The heavyweight-article support portion is formed to be thick in the vertical direction compared with the lightweight-article support portion. The lightweight-article support portion is provided at a position that is located in the insertion space of the heavyweight article when the heavyweight-article support portion is inserted into the insertion space of the heavyweight article, and formed integrally with the heavyweight-article support portion.

7 Claims, 9 Drawing Sheets

(a)

(b)

(c)

ARTICLE SUPPORTING DEVICE

CROSS-REFERENCE TO RELATED APPLICATION

This application claims priority to Japanese Patent Application No. 2014-045125 filed Mar. 7, 2014, the disclosure of which is hereby incorporated in its entirety by reference.

FIELD OF THE INVENTION

The present invention relates to an article supporting device provided with a support section that supports a support-target portion formed in a top end portion of a support object, the support section including a pair of support members for supporting both ends of the support-target portion in the first direction along the horizontal direction from below.

BACKGROUND

An example of the article supporting device as described above is described in JP 2003-171081A (Patent Document 1). The article supporting device of Patent Document 1 is configured so that the pair of support members are moved close to and inserted into an insertion space formed below the support-target portion of the support object, and both ends of the support-target portion in the direction in which the support members are placed side by side are supported by the inserted support members from below, whereby the support object is supported using the insertion space formed below the support-target portion.

SUMMARY OF THE INVENTION

The article supporting device of Patent Document 1 described above is configured to support a single kind of support objects. However, depending on the article supporting device, it is sometimes required to support a plurality of kinds of support objects different in weight.

To give an specific example, the article supporting device of Patent Document 1 handles front opening unified pods (FOUPs) that house semiconductor wafers as the support object. The FOUPs include a FOUP for 450 mm (an example of heavyweight articles) that houses 450 mm size semiconductor wafers and a FOUP for 300 mm (an example of lightweight articles) that houses 300 mm size semiconductor wafers. The device is sometimes required to transport these FOUPs different in weight. The FOUP for 450 mm and the FOUP for 300 mm, which are different in the size of the FOUP itself, are also different in the width of the insertion space formed below of the support-target portion in the vertical direction: the insertion space of the FOUP for 300 mm is narrow in the vertical direction compared with that of the FOUP for 450 mm.

As described above, when the article supporting device is to support a heavyweight article and a lightweight article as the support object, the insertion space of the lightweight article may sometimes be narrow in the vertical direction compared with that of the heavyweight article.

Also, when both the support-target portion of the heavyweight article and the support-target portion of the lightweight article are to be supported by the pair of support members, it is considered to increase the thickness of the support members in the vertical direction, compared with the case of supporting only lightweight articles small in weight, so as to ensure support of the heavyweight article.

However, with an increased thickness of the support members in the vertical direction, there is a possibility that the support members may interfere with the support-target portion of a lightweight article, etc. when the support members are inserted into the insertion space of the lightweight article because the insertion space of the lightweight article is narrow in the vertical direction compared with that of the heavyweight article as described above.

In view of the above, there is a demand for an article supporting device where, while the strength of the support members is enhanced, the support members hardly interfere with a lightweight article when the support members are inserted into the insertion space of the lightweight article.

The article supporting device according to the present invention includes:

a support section that supports a support-target portion provided in a top end portion of a support object; and a pair of support members that are provided in the support section and support both end portions of the support-target portion in a first direction along the horizontal direction from below, wherein the pair of support members are configured to be movable close to and away from each other in the first direction, the support object has an insertion space, below the support-target portion, into which the pair of support members are inserted by the movement of the pair of support members close to each other, the support object includes a lightweight article and a heavyweight article heavier than the lightweight article, the insertion space of the lightweight article is formed to be narrow in the vertical direction compared with the insertion space of the heavyweight article, each of the pair of support members includes a lightweight-article support portion that is inserted into the insertion space of the lightweight article and supports the support-target portion of the lightweight article from below and a heavyweight-article support portion that is inserted into the insertion space of the heavyweight article and supports the support-target portion of the heavyweight article from below, the heavyweight-article support portion is formed to be thick in the vertical direction compared with the lightweight-article support portion, and the lightweight-article support portion is provided at a position that is located in the insertion space of the heavyweight article when the heavyweight-article support portion is inserted into the insertion space of the heavyweight article, and formed integrally with the heavyweight-article support portion.

According to the above-described configuration, each of the pair of support members includes the lightweight-article support portion that supports the support-target portion of the lightweight article from below and the heavyweight-article support portion that supports the support-target portion of the heavyweight article from below, and the heavyweight-article support portion is formed to be thick in the vertical direction compared with the lightweight-article support portion.

The heavyweight-article support portion, formed to be thick, can be easily provided with a sufficient strength for supporting a heavyweight article. Therefore, by supporting the support-target portion of the heavyweight article with this heavyweight-article support portion from below, the heavyweight article can be supported appropriately with the support members.

The lightweight-article support portion, although being formed to be thin in the vertical direction compared with the heavyweight-article support portion, can be provided with a sufficient strength for supporting a lightweight article because the lightweight article is light in weight compared with the heavyweight article.

Also, the lightweight-article support portion, which is thin in the vertical direction, can be easily inserted into the insertion space of the lightweight article narrow in the vertical direction, and thus can be avoided from interfering with the lightweight article when being inserted into the insertion space.

Moreover, since the lightweight-article support portion and the heavyweight-article support portion are formed integrally, the configuration of the support section can be simplified compared with the case of providing the lightweight-article support portion and the heavyweight-article support portion separately. Also, since the lightweight-article support portion is formed at a position that is to be located in the insertion space of the heavyweight article when the heavyweight-article support portion is inserted into the insertion space of the heavyweight article, the lightweight-article support portion is housed inside the insertion space of the heavyweight article when the heavyweight article is supported. Thus, the article supporting device in the state of supporting the heavyweight article can be made compact.

As described above, the strength of the support members can be enhanced while simplification of the configuration of the support section and compacting of the article supporting device are achieved, and yet the support members can be made to hardly interfere with the lightweight article when the support members are inserted into the insertion space of the lightweight article.

Preferred embodiments of the present invention will be described hereinafter.

In an embodiment of the article supporting device according to the invention, preferably, the support-target portion of the heavyweight article is formed to be wide in a second direction perpendicular to the first direction as viewed from top compared with the support-target portion of the lightweight article, and the heavyweight-article support portion is constituted by a first portion located on a first side that is one side in the second direction with respect to the lightweight-article support portion and a second portion located on a second side that is the other side in the second direction with respect to the lightweight-article support portion, the first portion and the second portion being lined in the second direction.

According to the above-described configuration, when the heavyweight article is to be supported by the heavyweight-article support portion, the heavyweight-article support portion is inserted into the insertion space of the heavyweight article, and portions of the support-target portion of the heavyweight article located on both sides in the second direction with respect to the lightweight-article support portion are supported by the first and second portions of the heavyweight-article support portion from below.

The lightweight-article support portion, provided between the first portion and the second portion of the support member, is located below an intermediate portion of the support-target portion of the heavyweight article in the second direction, and located in the insertion space of the heavyweight article, when the heavyweight-article support portion supports the heavyweight article as described above. Incidentally, the portion of the support member between the first portion and the second portion corresponds to the position located in the insertion space of the heavyweight article when the heavyweight-article support portion is inserted into the insertion space of the heavyweight article.

The support-target portion of the heavyweight article is supported by the first and second portions of the heavyweight-article support portion, and the support-target portion of the lightweight article is supported by the lightweight-article support portion located between the first and second portions of the heavyweight-article support portion. With the pair of support members each configured as described above, the length of the support member in the first direction can be reduced, and thus reduction in the size of the support member can be achieved, compared with the case of forming the heavyweight-article support portion having a length supporting the entire length of the support-target portion of the heavyweight article in the second direction and forming the lightweight-article support portion side by side with the heavyweight-article support portion in the first direction.

In an embodiment of the article supporting device according to the invention, preferably, each of the pair of support members includes a plate-like body having a top surface on which a downwardly recessed portion is formed in an intermediate portion in the second direction, and the lightweight-article support portion is formed of the recessed portion, and the first portion and the second portion are formed of portions located on both sides of the recessed portion in the second direction.

According to the above-described configuration, the support member of which the heavyweight-article support portion includes the first portion located on one side in the second direction with respect to the lightweight-article support portion and the second portion located on the other side in the second direction with respect to the lightweight-article support portion can be formed appropriately using a plate-like body having a top surface where a downwardly recessed portion is formed in an intermediate portion in the second direction.

In an embodiment of the article supporting device according to the invention, preferably, the lightweight article includes a protrusion located on the first side in the second direction with respect to the support-target portion of the lightweight article, the protrusion is formed so that the top end is located above the bottom end of the insertion space of the lightweight article, and the first portion is formed to be short in the second direction compared with the second portion, and the first portion is located closer to the second side in the second direction than the protrusion is in the state where the support-target portion of the lightweight article is supported by the lightweight-article support portion.

When the lightweight article has a protrusion formed to stand on the first side in the second direction with respect to the support-target portion and have a top end located above the bottom end of the insertion space, there is a possibility that the first portion of the heavyweight-article support portion may interfere with the protrusion when the lightweight-article support portion supports the support-target portion of the lightweight article.

In view of the above, the first portion is made short in the second direction compared with the second portion. With this, it becomes easy to avoid the first portion of the heavyweight-article support portion from interfering with the protrusion when the lightweight-article support portion supports the support-target portion of the lightweight article. Also, by making the first portion short in the second direction compared with the second portion, i.e., by making the second portion long in the second direction compared with the first portion, the support-target portion of the heavyweight article can be supported by the pair of support members over a wide range in the second direction, compared with the case of making the second portion short like the first portion. This makes it easy to support the heavyweight article with stability.

In an embodiment of the article supporting device according to the invention, preferably, the support-target portion of the heavyweight article is formed to be wide in the first direction compared with the support-target portion of the lightweight article, the device further includes a first spacing switching drive section that moves the pair of support members close to and away from each other horizontally in the first direction to switch the spacing between the pair of support members in the first direction, and the first spacing switching drive section is configured to be able to switch the spacing between the pair of support members in the first direction among a lightweight-article support spacing that is narrower than the width of the support-target portion of the lightweight article in the first direction, a heavyweight-article support spacing that is wider than the lightweight-article support spacing and narrower than the width of the support-target portion of the heavyweight article in the first direction, and a retraction support spacing that is a spacing wider than the width of the support-target portion of the heavyweight article in the first direction.

According to the above-described configuration, the pair of support members can be inserted into the insertion space of the lightweight article by switching the spacing between the support members to the lightweight-article support spacing, and the support members can be inserted into the insertion space of the heavyweight article by switching the spacing between the support members to the heavyweight-article support spacing. Also, the support members can be taken out from the insertion space of the heavyweight article by switching the spacing between the support members to the extraction support spacing.

Since the support members are inserted into and taken out from the insertion space of the support object by moving the support members close to and away from each other horizontally in the first direction thereby switching the spacing between the support members, the support members do not move vertically when being inserted into and taken out from the insertion space, compared with the case of inserting the support members into and taken them out from the insertion space by swinging the support members around a pivot shaft center along the horizontal direction. Thus, the support members can be made to hardly interfere with the support object.

In an embodiment of the article supporting device according to the invention, preferably, the article supporting device further includes: a position detection section that detects the position of the pair of support members; a first control section that controls the operation of the first spacing switching drive section so as to switch the spacing between the pair of support members among the lightweight-article support spacing, the heavyweight-article support spacing, and the retraction support spacing based on detection information from the position detection section; and a first determination section that determines whether the support object supported by the pair of support members is the lightweight article or the heavyweight article based on the detection information from the position detection section.

According to the above-described configuration, by controlling the operation of the spacing switching drive section based on the detection information from the position detection section that detects the position of the support members, the first control section can switch the spacing between the support members among the lightweight-article support spacing, the heavyweight-article support spacing, and the retraction support spacing appropriately. Also, since the position of the support members is different between when the spacing between the support members is switched to the lightweight-article support spacing to support the lightweight article and when the spacing between the support members is switched to the heavyweight-article support spacing to support the heavyweight article, the first determination section can determine whether the support object supported by the support members is the lightweight article or the heavyweight article based on the detection information from the position detection section.

The detection section provided for determining whether the support object is the lightweight article or the heavyweight article can also serve as the detection section that detects the position of the support members for the control of the first spacing switching drive section by the first control section. Thus, the configuration of the article supporting device can be simplified.

In an embodiment of the article supporting device according to the invention, preferably, the heavyweight article is formed to be large in contour compared with the lightweight article, the support section is supported by a movable body that moves along a movement path, and the device further includes: a hoisting drive section that lifts and lowers the pair of support members between a lifted height where the pair of support members support the support object staying at a support height and a lowered height that is lower than the support height and the same as the height of the insertion space of the support object staying at a transfer object position; a size detection section that detects the size of the support object staying at the transfer object position; a second spacing switching drive section that moves the pair of support members close to and away from each other in the first direction; a second determination section that determines whether the support object staying at the transfer object position is the lightweight article or the heavyweight article based on detection information from the size detection section; and a second control section that controls the operations of the second spacing switching drive section and the hoisting drive section so as to support the support object staying at the transfer object position with the pair of support members and lift the supported support object up to the support height based on determination information from the second determination section.

According to the above-described configuration, the support object can be lowered to the transfer object position by lowering the pair of support members to the lowered height by the hoisting drive section in the state where the support object is supported by the support members. Also, the support object can be lifted from the transfer object position by lifting the support members to the lifted height by the hoisting drive section in the state where the support members are inserted in the insertion space of the support object staying at the transfer object position.

Since the lightweight article and the heavyweight article are different in contour, the second determination section can determine whether the support object staying at the transfer object position is the lightweight article or the heavyweight article based on the detection information from the size detection section.

Since the lightweight article and the heavyweight article are different in contour, also, the lowered height for the lightweight article is sometimes different from the lowered height for the heavyweight article, and the spacing between the pair of support members when the support members are inserted into the insertion space of the lightweight article is sometimes different from the spacing between the support members when the support members are inserted into the insertion space of the heavyweight article. However, since the second control section controls the operations of the second spacing switching drive section and the hoisting drive section based on the determination information from the second determination section, the support members can be moved to the height and the spacing corresponding to the size of the support object staying at the transfer object position, and thus the support object can be supported appropriately irrespective of the size thereof.

DETAILED DESCRIPTION

An embodiment of the article supporting device according to the present invention as applied to an article transport facility will be described hereinafter with reference to the accompanying drawings.

Figure 1:
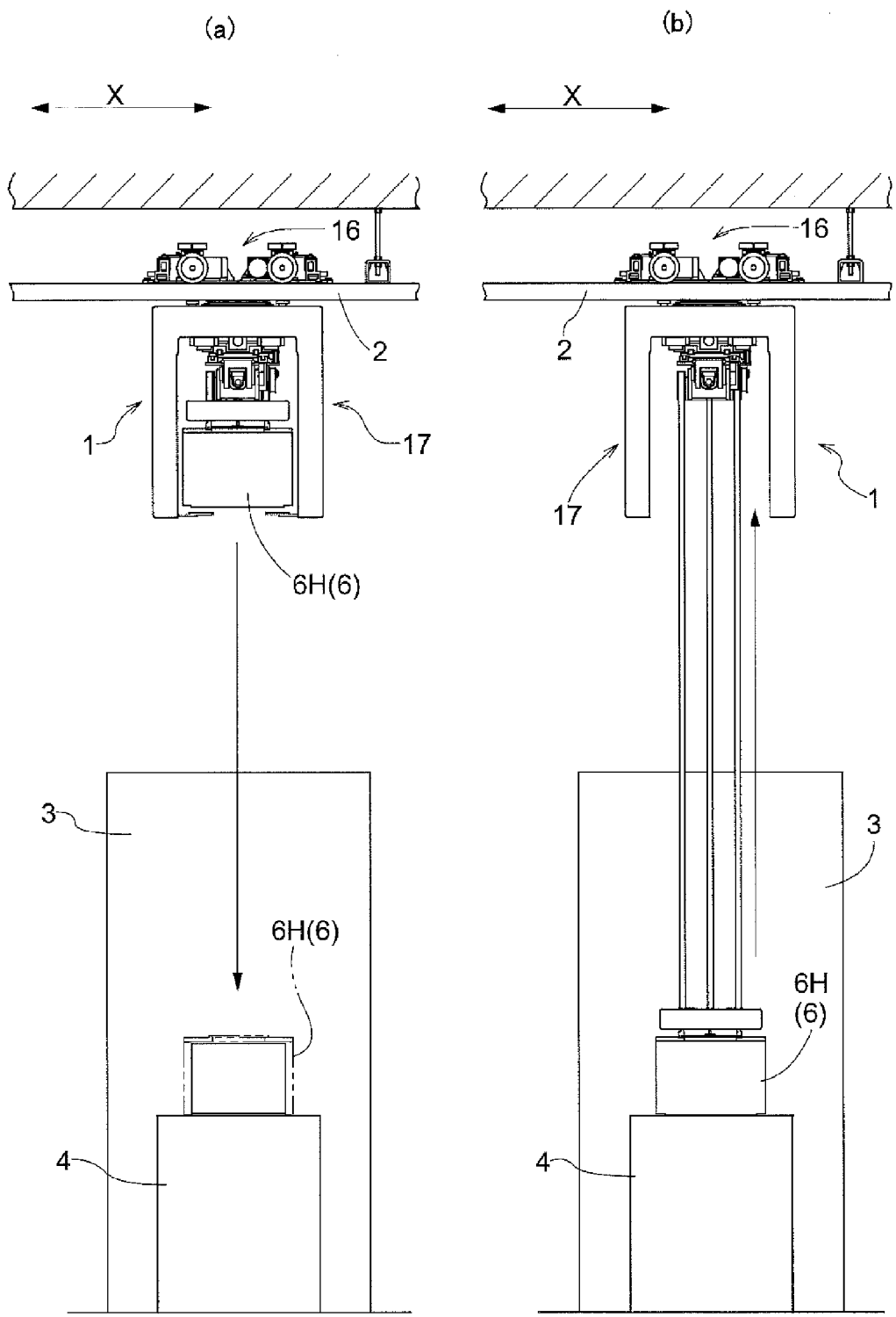
FIG. 1 shows side views of an article transport facility.

As shown in FIG. 1, the article transport facility includes: a ceiling transport vehicle 1 as the article supporting device that can travel along a movement path under the guidance and support of a traveling rail 2 placed along the movement path on the ceiling; a processing device 3 that performs processing for a substrate; and a support platform 4 placed on the floor adjacent to the processing device 3. A transport article 6 as the support object to be transported by the ceiling transport vehicle 1 is a transport container that houses contents, specifically which is a FOUP that houses semiconductor wafers as the contents.

Transport Article

Figure 2:
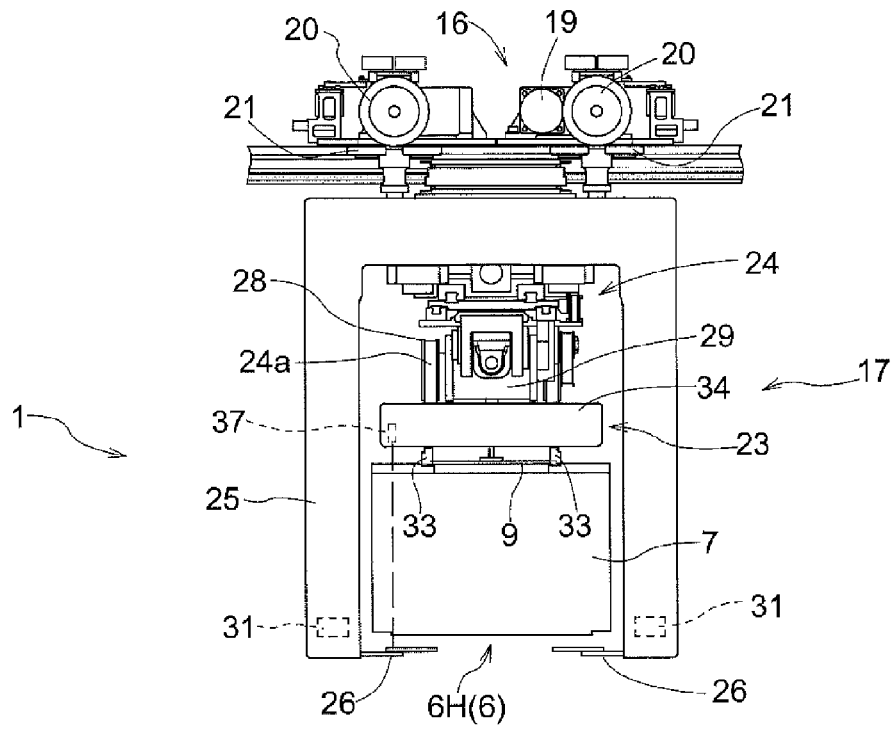
FIG. 2 is a side view showing a ceiling transport vehicle transporting a heavyweight transport article.
Figure 3:
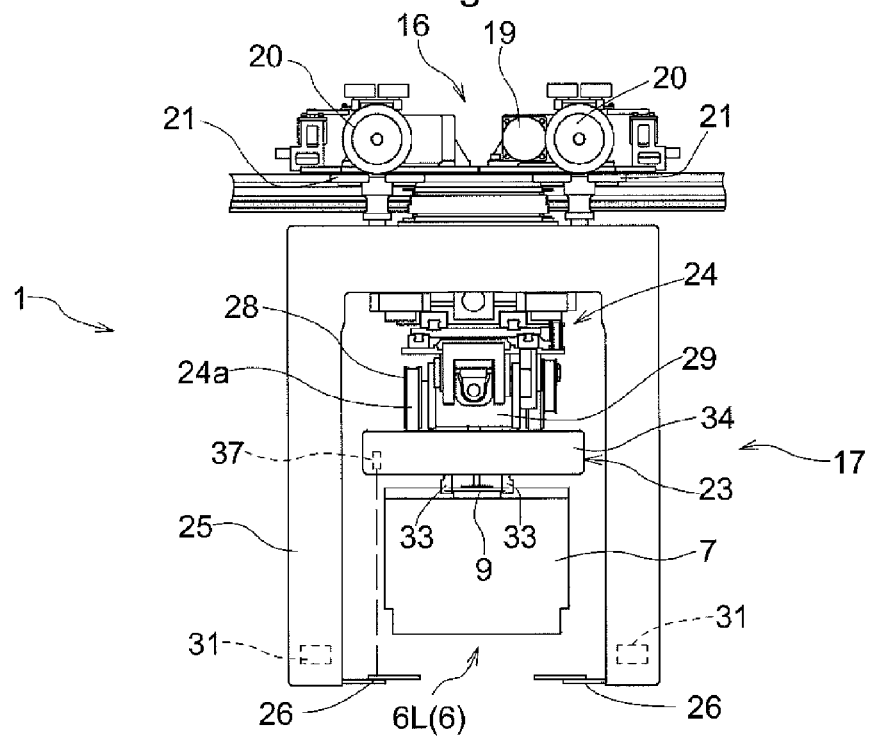
FIG. 3 is a side view showing a ceiling transport vehicle transporting a lightweight transport article.

As shown in FIGS. 2 and 3, the transport article 6 includes a lightweight transport article 6L (in this embodiment, a FOUP that houses 300 mm size semiconductor wafers, which corresponds to the lightweight article) and a heavyweight transport article 6H (in this embodiment, a FOUP that houses 450 mm size semiconductor wafers, which corresponds to the heavyweight article), which is heavier than the lightweight transport article 6L. The heavyweight transport article 6H is large in contour in the vertical direction, in the container left-right direction, and in the container front-rear direction, compared with the lightweight transport article 6L, and configured to have a body portion 7 capable of housing larger semiconductor wafers than those of the lightweight transport article 6L. In the illustrated example, the container left-right direction corresponds to the first direction, and the container front-rear direction corresponds to the second direction.

Incidentally, FIG. 1 shows states where the ceiling transport vehicle 1 delivers and receives the transport article 6 to and from the support platform 4 of the processing device 3 taking the heavyweight transport article 6H as an example. FIG. 2 is a view showing the ceiling transport vehicle 1 that is transporting the heavyweight transport article 6H, and FIG. 3 is a view showing the ceiling transport vehicle 1 that is transporting the lightweight transport article 6L.

As for the lightweight transport article 6L and the heavyweight transport article 6H, in comparison between the lightweight transport article 6L that houses the largest allowable amount of semiconductor wafers and the heavyweight transport article 6H that houses the largest allowable amount of semiconductor wafers, the latter is larger in weight than the former. Note however that, since the lightweight article and the heavyweight article are defined considering the state where the transport article 6 is heaviest (state where the largest allowable amount of semiconductor wafers is housed), the lightweight transport article 6L may sometimes be heavier than the heavyweight transport article 6H depending on the amount of housed semiconductor wafers.

As described in FIGS. 7 to 10, each of the lightweight transport article 6L and the heavyweight transport article 6H includes: the body portion 7 that houses a plurality of substrates (semiconductor wafers); a support-target portion 9 formed in a top end portion of the transport article 6 to stay above the body portion 7; a connection portion 8 that connects the body portion 7 and the support-target portion 9; and a removable cover member (not shown) that closes an opening formed in the front of the body portion 7 for loading/unloading the substrates.

The support-target portion 9 is formed into a shape protruding from the connection portion 8 in the container front-rear direction and in the container left-right direction, forming an insertion space 12 between the top surface of the body portion 7 and the bottom surface of the support-target portion 9. The insertion space 12, formed below the support-target portion 9 of the transport article 6, constitutes the space that is provided below the support-target portion 9 of the transport article 6 and into which a pair of support members 33 to be described later are inserted in the container left-right direction.

An edge portion 14 is formed to surround the opening for loading/unloading of the substrates, and formed into a shape protruding upward from the top surface of the body portion 7.

Figure 7:
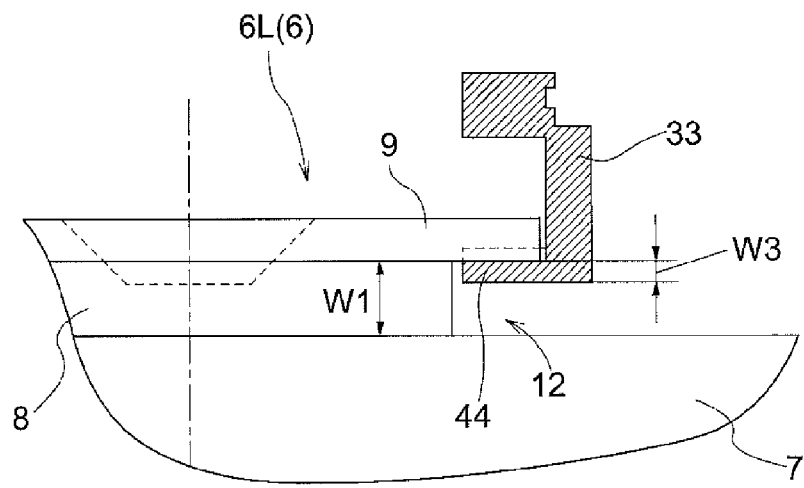
FIG. 7 is a side view showing a support member supporting a lightweight transport article.
Figure 8:
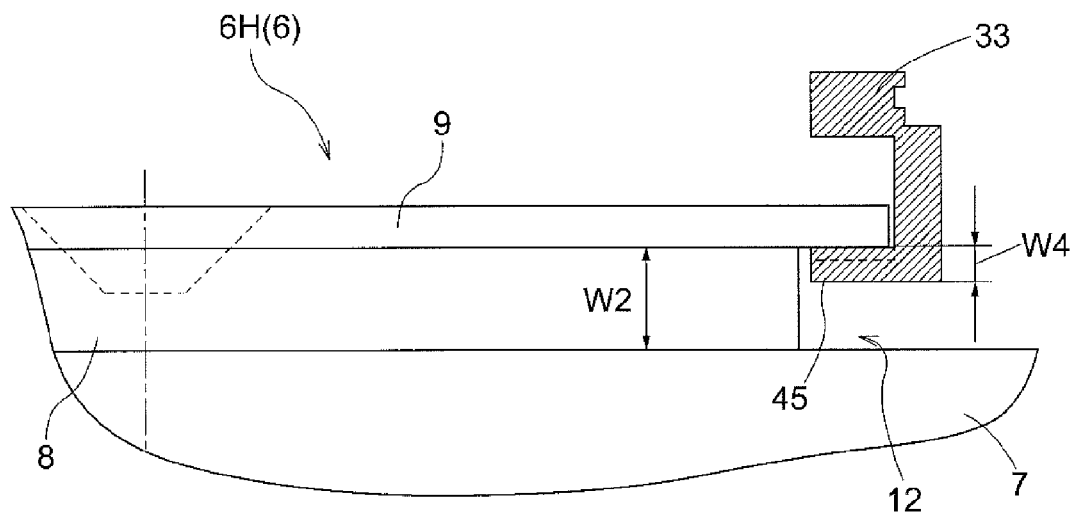
FIG. 8 is a side view showing a support member supporting a heavyweight transport article.

As shown in FIGS. 7 and 8, the connection portion 8 of the heavyweight transport article 6H is formed to be long in the vertical direction, compared with the connection portion 8 of the lightweight transport article 6L. Therefore, the width W1 of the insertion space 12 of the lightweight transport article 6L in the vertical direction is formed to be small compared with the width W2 of the insertion space 12 of the heavyweight transport article 6H in the vertical direction.

Also, the support-target portion 9 of the heavyweight transport article 6H is formed to be wide in the container front-rear direction and in the container left-right direction, compared with the support-target portion 9 of the lightweight transport article 6L.

Figure 9:
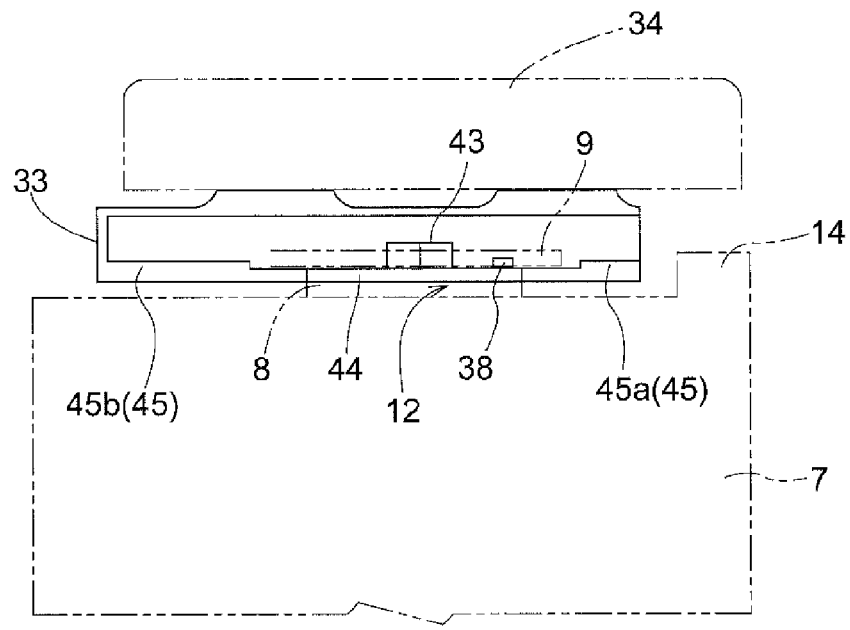
FIG. 9 is a front view showing a support member supporting a lightweight transport article.

The edge portion 14 of the lightweight transport article 6L corresponds to the protrusion lying on one side in the container front-rear direction (on the first side in the second direction) with respect to the support-target portion 9. As shown in FIG. 9, the edge portion 14 of the lightweight transport article 6L protrudes upward from the top surface of the body portion 7 with the top end of the edge portion 14 lying above the top surface of the body portion 7 and above the bottom surface of the support-target portion 9 in the vertical direction. Thus, the edge portion 14 of the lightweight transport article 6L is formed so that the top end thereof lies above the bottom end of the insertion space 12. In the illustrated example, the edge portion 14 of the lightweight transport article 6L is formed so that the top end thereof lies above the top end of the insertion space 12.

Figure 11:
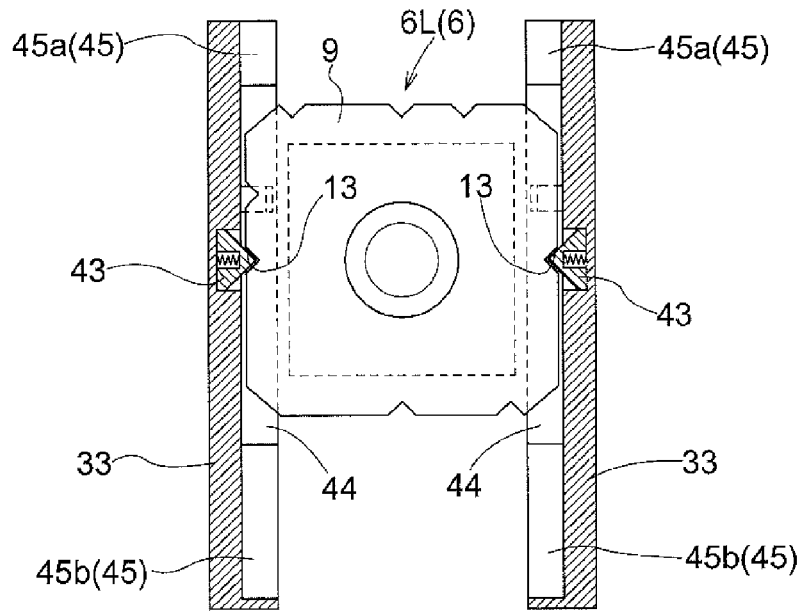
FIG. 11 is a plan view showing support members supporting a lightweight transport article.
Figure 12:
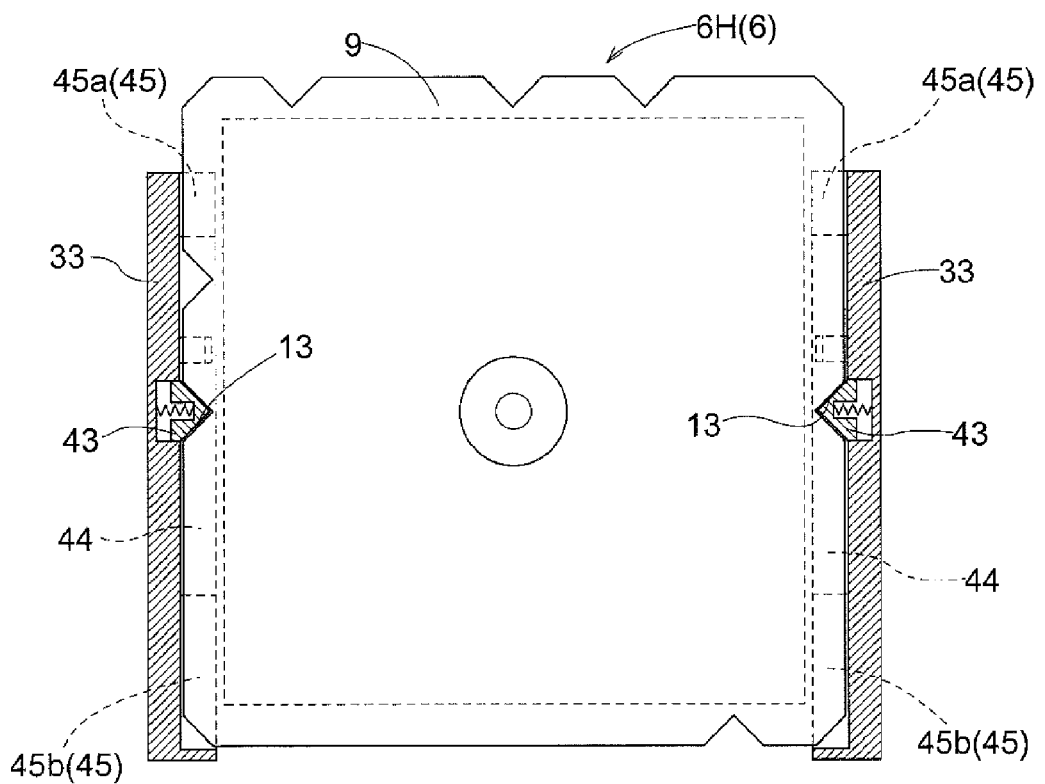
FIG. 12 is a plan view showing support members supporting a heavyweight transport article.

As shown in FIGS. 11 and 12, each of the support-target portion 9 of the lightweight transport article 6L and the support-target portion 9 of the heavyweight transport article 6H has cuts 13 for positioning in a V shape as viewed from top at end portions of the support-target portion 9 in the container left-right direction.

The cuts 13 formed on the support-target portion 9 of the heavyweight transport article 6H are large in shape compared with the cuts 13 formed on the support-target portion 9 of the lightweight transport article 6L.

Ceiling Transport Vehicle

Next, the ceiling transport vehicle 1 will be described. Before the description of the ceiling transport vehicle 1, it should be noted that the direction along the traveling direction of the ceiling transport vehicle 1 is referred to as the front-rear direction X, and the direction orthogonal to the front-rear direction X as viewed from top is referred to as the left-right direction Y. In the illustrated example, the front-rear direction X corresponds to the first direction, and the left-right direction Y corresponds to the second direction. The first direction is a direction along the horizontal direction, and in this example, the second direction is also a direction along the horizontal direction (but orthogonal to the first direction).

Also, the transport article 6 is supported by a hoisting support unit 17 in a state where the container left-right direction thereof is along the front-rear direction X of the ceiling transport vehicle 1. Therefore, bearing in mind the transport article 6 supported by the hoisting support unit 17, the container left-right direction of the transport article 6 is described as being the front-rear direction X, and the container front-rear direction of the transport article 6 as being the left-right direction Y.

As shown in FIGS. 1 to 3, the ceiling transport vehicle 1 includes a traveling unit 16 that travels along the movement path on the traveling rail 2 and the hoisting support unit 17 that is suspended from and supported by the traveling unit 16 so as to be located below the traveling rail 2. The hoisting support unit 17 supports a support mechanism 23 that supports the transport article 6 so that it can be lifted and lowered. The traveling unit 16 corresponds to the movable body that moves along the movement path. Also, the support mechanism 23 corresponds to the support section that supports the support-target portion 9 formed in the top end portion of the transport article 6. In this example, the support section (support mechanism 23) is supported by the movable body (traveling unit 16).

As shown in FIGS. 2 and 3, the traveling unit 16 is provided with drive wheels 20 rolling on the top surface of the traveling rail 2 by being rotated with a motor 19 for traveling and rotatable guide wheels 21 abutting against the side faces of the traveling rail 2. The traveling unit 16 is configured to travel along the movement path under the guidance of the traveling rail 2 with the drive wheels 20 rotating with the motor 19 for traveling and the guide wheels 21 being guided in contact with the traveling rail 2.

The hoisting support unit 17 includes: the above-described support mechanism 23 that supports the transport article 6; a hoisting operation mechanism 24 that lifts and lowers the support mechanism 23; a cover 25 that covers the upper side and both sides in the front-rear direction X of the transport article 6 staying at the support height by being supported by the support mechanism 23 (see FIGS. 2 and 3); and drop prevention members 26 that prevent dropping of the transport article 6 supported at the support height by the support mechanism 23.

The hoisting operation mechanism 24 includes a winder 28 around which a belt 24a is wound and a motor 29 for hoisting that rotates the winder 28. The belt 24a is coupled to the support mechanism 23 at its top end to support the support mechanism 23. The support mechanism 23 is lifted and lowered by rotating the winder 28 normally and reversely with the motor 29 for hoisting, to wind the belt 24a around and let it out from the winder 28. The motor 29 for hoisting corresponds to the hoisting drive section.

The support mechanism 23 has a pair of support members 33 that support both end portions of the support-target portions 9 in the front-rear direction X from below, and is configured so that, by rotating the winder 28 normally and reversely with the motor 29 for hoisting thereby lifting and lowering the support mechanism 23 as described above, the support members 33 are lifted and lowered between the lifted height (see FIGS. 1(a), 2, and 3) where the support members 33 support the transport article 6 staying at the support height and the lowered height (see FIG. 1(b)), lower than the support height, where the support members 33 are at the same height as the insertion space 12 of the transport article 6 lying on the support platform 4.

The hoisting operation mechanism 24 lifts the support members 33 to the lifted height by winding the belt 24a as shown in FIG. 1(a), thereby lifting the transport article 6 supported by the support mechanism 23 to the support height. Also, the hoisting operation mechanism 24 lowers the support members 33 to the lowered height by letting out the belt 24a as shown in FIG. 1(b), thereby lowering the transport article 6 supported by the support mechanism 23 to the transfer height.

Incidentally, since the heavyweight transport article 6H is large in contour compared with the lightweight transport article 6L, the position of the insertion space 12 of the heavyweight transport article 6H lying on the transfer object position (the heavyweight transport article 6H staying at the transfer height) is higher than that of the insertion space 12 of the lightweight transport article 6L lying on the transfer object position (the lightweight transport article 6L staying at the transfer height). Therefore, the lowered height of the support members 33 at the time of supporting the heavyweight transport article 6H is set to be higher than the lowered height of the support members 33 at the time of supporting the lightweight transport article 6L. Note that the lifted height of the support members 33 at the time of supporting the heavyweight transport article 6H is set to be the same as the lifted height of the support members 33 at the time of supporting the lightweight transport article 6L. The transport article 6 at the support height stays inside the cover 25 as shown in FIG. 1(a), and the transport article 6 at the transfer height stays on the support platform 4 as the transfer object position as shown in FIG. 1(b).

The drop prevention members 26, which are a pair of members lined in the front-rear direction X, are configured so that the spacing between the pair of drop prevention members 26 can be changed between a catching spacing (see FIGS. 1(a), 2, and 3) that is narrower than the width of the lightweight transport article 6L in the front-rear direction X and a retraction spacing (see FIG. 1(b)) that is wider than the width of the heavyweight transport article 6H in the front-rear direction X.

By changing the spacing between the drop prevention members 26 to the catching spacing with the drive of motors 31 for drop prevention, the transport article 6 can be caught by the drop prevention members 26 even if the support of the transport article 6 by the support mechanism 23 is disengaged during traveling of the ceiling transport vehicle 1, thereby preventing the transport article 6 from dropping onto the floor. Also, by changing the spacing between the drop prevention members 26 to the retraction spacing with the drive of the motors 31 for drop prevention, the transport article 6 can be delivered to and received from the support platform 4 by lifting and lowering the support mechanism 23 as shown in FIG. 1.

Support Mechanism

Additional description will be made on the support mechanism 23 of the ceiling transport vehicle 1.

Figure 4:
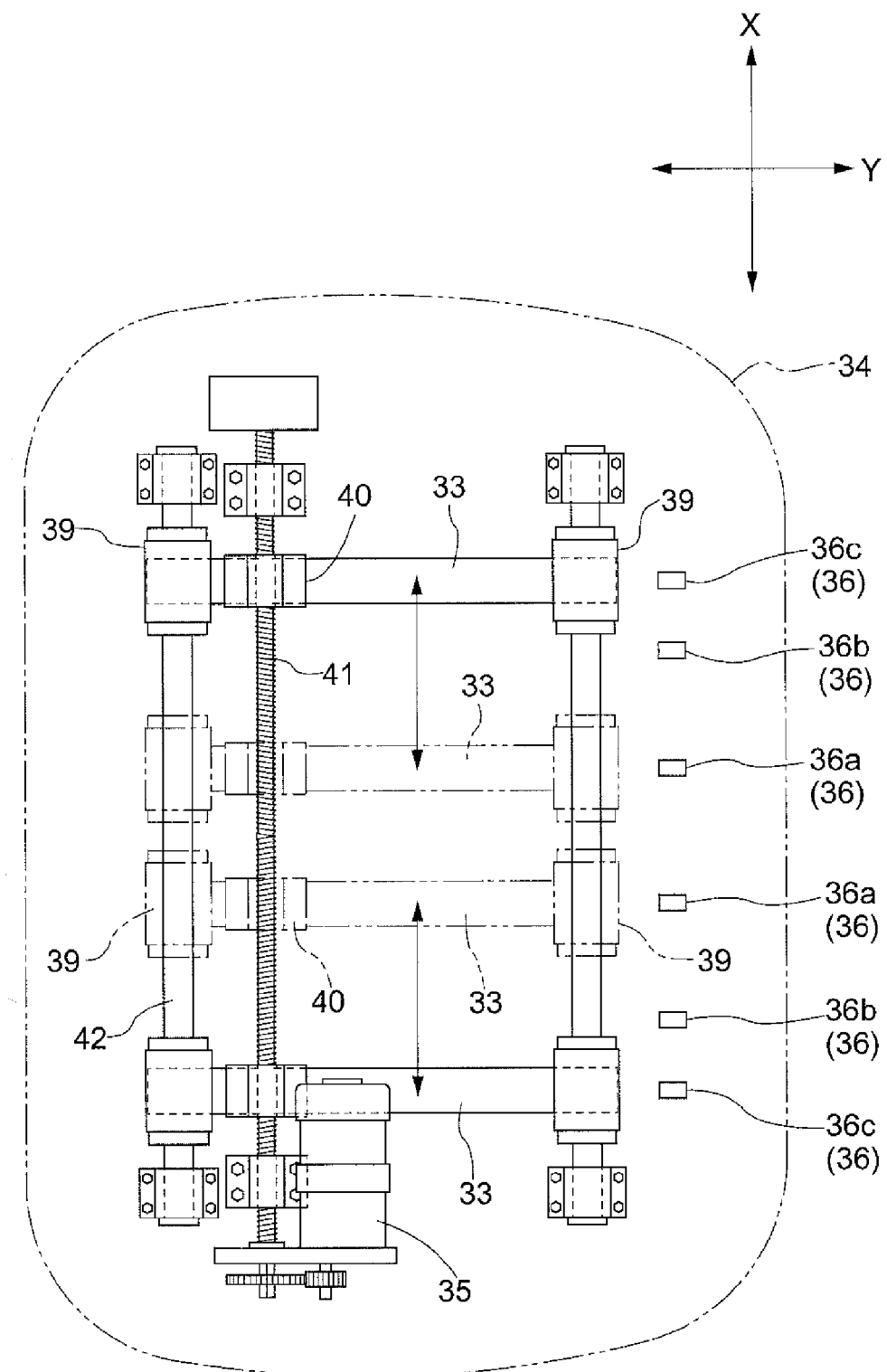
FIG. 4 is a plan view of the inside of a hoist body.

As shown in FIGS. 2 to 4, the support mechanism 23 of the ceiling transport vehicle 1 includes: the pair of support members 33 that support both end portions of the support-target portion 9 of the transport article 6 in the front-rear direction X from below; a hoist body 34 that supports the support members 33 so that the support members 33 can move closer to and away from each other in the front-rear direction X (movably in the opposite directions to each other); and a motor 35 for spacing switching that switches the spacing between the support members 33 in the front-rear direction X.

The support members 33 are configured to be movable closer to and away from each other in the front-rear direction X. By moving the support members 33 closer to and away from each other in the front-rear direction X with the drive of the motor 35 for spacing switching, the spacing between the support members 33 in the front-rear direction X can be switched among a lightweight-article support spacing, a heavyweight-article support spacing, and a retraction support spacing. The motor 35 for spacing switching corresponds to the first spacing switching drive section and the second spacing switching drive section.

The lightweight-article support spacing is set so that the spacing between the support members 33 in the front-rear direction X is narrower than the width of the support-target portion 9 of the lightweight transport article 6L in the front-rear direction X. The heavyweight-article support spacing is set so that the spacing between the support members 33 in the front-rear direction X is wider than the lightweight-article support spacing and narrower than the width of the support-target portion 9 of the heavyweight transport article 6H in the front-rear direction X. The retraction support spacing is set so that the spacing between the support members 33 in the front-rear direction X is wider than the width of the support-target portion 9 of the heavyweight transport article 6H in the front-rear direction X.

As shown in FIG. 4, guide members 39 are provided on both end portions of each of the support members 33 in the length direction (left-right direction Y), and a movable member 40 is provided in an intermediate portion thereof in the length direction. The hoist body 34 includes a ball screw 41 threaded into the movable members 40, the motor 35 for spacing switching that rotates the ball screw 41, and an guide rail 42 that guides the guide members 39 in the front-rear direction X. By rotating the ball screw 41 with the motor 35 for spacing switching, the guide members 39 are guided by the guide rail 42, and the support members 33 move close to or away from each other in the front-rear direction X, whereby the spacing between the support members 33 is switched among the lightweight-article support spacing, the heavyweight-article support spacing, and the retraction support spacing.

As shown in FIGS. 11 and 12, each of the support members 33 is provided with a positioning protrusion 43.

The positioning protrusions 43 are configured to fit in the cuts 13 of the support-target portion 9 of the heavyweight transport article 6H when the spacing between the support members 33 is switched to the heavyweight-article support spacing and the support members 33 are inserted into the insertion space 12 of the heavyweight transport article 6H. Also, the positioning protrusions 43 are configured to fit in the cuts 13 of the support-target portion 9 of the lightweight transport article 6L when the spacing between the support members 33 is switched to the lightweight-article support spacing and the support members 33 are inserted into the insertion space 12 of the lightweight transport article 6L.

As described above, in the state where the transport article 6 is supported by the support members 33, the positioning protrusions 43 fit in the cuts 13 of the transport article 6, thereby limiting the transport article 6 from moving in the left-right direction Y with respect to the support members 33.

Each of the support members 33 includes: a lightweight-article support portion 44 that is inserted into the insertion space 12 of the lightweight transport article 6L and supports the support-target portion 9 of the lightweight transport article 6L from below; and a heavyweight-article support portion 45 that is inserted into the insertion space 12 of the heavyweight transport article 6H and supports the support-target portion 9 of the heavyweight transport article 6H from below. As shown in FIGS. 7 to 10, the heavyweight-article support portion 45 is formed to be thick in the vertical direction compared with the lightweight-article support portion 44.

In this embodiment, the heavyweight-article support portion 45 includes: a first portion 45a located on the first side (upper left side in FIG. 5) that is one side in the left-right direction Y with respect to the lightweight-article support portion 44; and a second portion 45b located on the second side (lower right side in FIG. 5) that is the other side in the left-right direction Y with respect to the lightweight-article support portion 44, which are lined in the left-right direction Y. The lightweight-article support portion 44 is provided between the first portion 45a and the second portion 45b.

Figure 5:
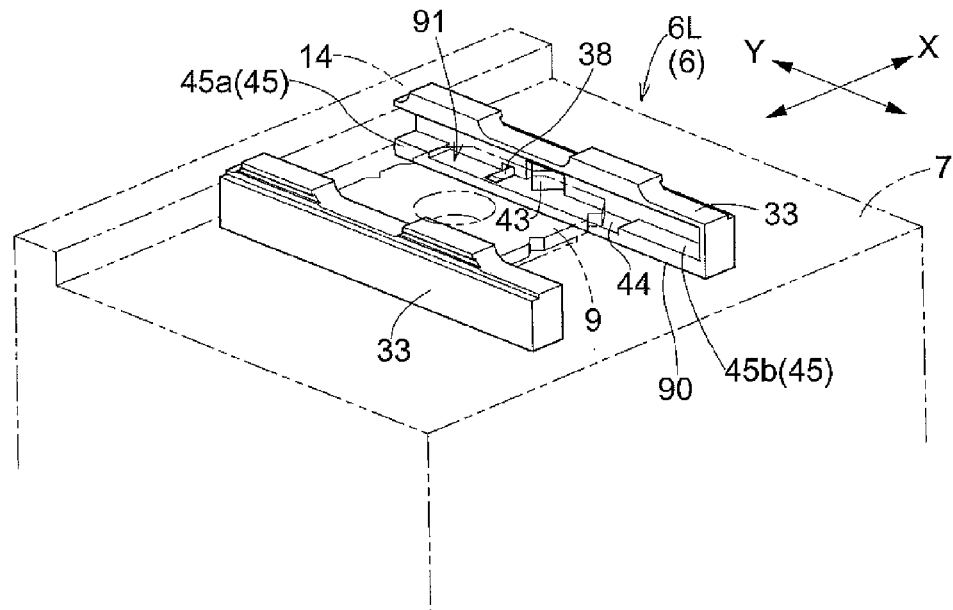
FIG. 5 is a perspective view showing a pair of support members with a lightweight-article support spacing therebetween.

That is, the first and second portions 45a and 45b of the heavyweight-article support portion 45 and the lightweight-article support portion 44 are provided in the order of the first portion 45a of the heavyweight-article support portion 45, the lightweight-article support portion 44, and the second portion 45b of the heavyweight-article support portion 45 from the one side (first side) in the left-right direction Y, and the lightweight-article support portion 44 is provided in the support member 33 integrally with the heavyweight-article support portion 45. In this example, as shown in FIG. 5, each of the support members 33 includes a plate-like body 90 having a downwardly recessed portion 91 in the intermediate portion in the left-right direction Y. The lightweight-article support portion 44 is formed of the recessed portion 91, and the first portion 45a and the second portion 45b are formed of the portions of the top surface of the plate-like body 90 located on both sides of the recessed portion 91 in the left-right direction Y. Note that the portion of the top surface of the plate-like body 90 forming the first portion 45a and the portion thereof forming the second portion 45b are flat and level with each other. The recessed portion 91 is also flat and located below the portions of the top surface of the plate-like body 90 forming the first portion 45a and the second portion 45b.

Moreover, in this example, the bottom surface of the plate-like body 90 is flat. That is, the bottom surface of the portion of the plate-like body 90 constituting the lightweight-article support portion 44 and the bottom surface of the portions of the plate-like body 90 constituting the heavyweight-article support portion 45 are level with each other.

In this example, the first portion 45a supports an end portion of the support-target portion 9 of the heavyweight transport article 6H on the first side in the left-right direction Y, and the second portion 45b supports an end portion of the support-target portion 9 of the heavyweight transport article 6H on the second side in the left-right direction Y Note that the "end portion of the support-target portion 9 on the first side in the left-right direction Y" refers to a region closest to the first side in the left-right direction Y when the support-target portion 9 is divided into three equal regions in the left-right direction Y (this region is hereinafter referred to as the "first region"). The "end portion of the support-target portion 9 on the second side in the left-right direction Y" refers to a region closest to the second side in the left-right direction Y when the support-target portion 9 is divided into three equal regions in the left-right direction Y (this region is hereinafter referred to as the "second region"). The wording that the first portion 45a "supports an end portion of the support-target portion 9 on the first side in the left-right direction Y" means that it supports the support-target portion 9 in at least part of the first region, and the wording that the second portion 45b "supports an end portion of the support-target portion 9 on the second side in the left-right direction Y" means that it supports the support-target portion 9 in at least part of the second region. That is, the concept of "supporting an end portion of the support-target portion 9 in the left-right direction Y" may include a case of not supporting an edge of the support-target portion 9 in the left-right direction Y.

Figure 10:
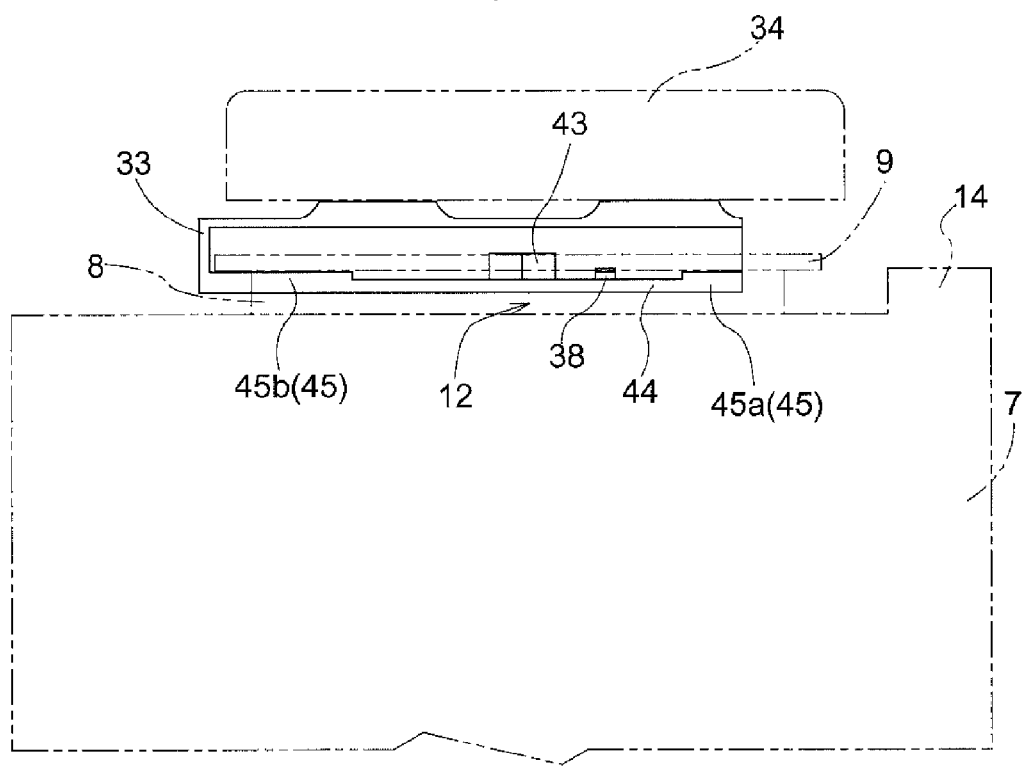
FIG. 10 is a front view showing a support member supporting a heavyweight transport article.

As shown in FIGS. 9 and 10, the top surface of the lightweight-article support portion 44 is located below the top surface of the heavyweight-article support portions 45, and the bottom surface of the lightweight-article support portion 44 is level with the bottom surface of the heavyweight-article support portions 45. Therefore, the width W3 of the lightweight-article support portion 44 in the vertical direction is smaller than the width W4 of the heavyweight-article support portions 45 in the vertical direction. The width W3 of the lightweight-article support portion 44 is formed to be smaller than the width W1 of the insertion space 12 of the lightweight transport article 6L, to permit insertion of the lightweight-article support portion 44 into the insertion space 12 of the lightweight transport article 6L. Likewise, the width W4 of the heavyweight-article support portion 45 is formed to be smaller than the width W2 of the insertion space 12 of the heavyweight transport article 6H, to permit insertion of the heavyweight-article support portion 45 into the insertion space 12 of the heavyweight transport article 6H.

As shown in FIGS. 7 and 8, the gap formed between the lightweight-article support portion 44 and the body portion 7 of the lightweight transport article 6L when the lightweight-article support portion 44 supports the support-target portion 9 of the lightweight transport article 6L is the same as the gap between the heavyweight-article support portion 45 and the body portion 7 of the heavyweight transport article 6H in the vertical direction formed when the heavyweight-article support portion 45 supports the support-target portion 9 of the heavyweight transport article 6H.

The width of the lightweight-article support portion 44 in the left-right direction Y is formed to be larger than the width of the support-target portion 9 of the lightweight transport article 6L in the left-right direction Y, and smaller than the width of the support-target portion 9 of the heavyweight transport article 6H in the left-right direction Y.

Therefore, when the lightweight-article support portion 44 supports the support-target portion 9 of the lightweight transport article 6L, the support-target portion 9 is prevented from protruding from the lightweight-article support portion 44 on the one side or the other side in the left-right direction Y. At this time, the first portion 45a of the heavyweight-article support portion 45 is located on the one side (first side) in the left-right direction Y with respect to the support-target portion 9 of the lightweight transport article 6L, and the second portion 45b of the heavyweight-article support portion 45 is located on the other side (second side) in the left-right direction Y with respect to the support-target portion 9 of the lightweight transport article 6L.

When the heavyweight-article support portion 45 supports the support-target portion 9 of the heavyweight transport article 6H, the support-target portion 9 can be supported over the first portion 45a and the second portion 45b of the heavyweight-article support portion 45.

The first portion 45a of the heavyweight-article support portion 45 is formed to be small in length in the left-right direction Y compared with the second portion 45b thereof.

Therefore, when the heavyweight-article support portion 45 supports the support-target portion 9 of the heavyweight transport article 6H, the support-target portion 9 protrudes from the heavyweight-article support portion 45 on the one side (first side) in the left-right direction Y although not protruding from the heavyweight-article support portion 45 on the other side (second side) in the left-right direction Y. At this time, the lightweight-article support portion 44 is located below the intermediate portion of the support-target portion 9 in the left-right direction Y, lying in the insertion space 12 of the heavyweight transport article 6H. Thus, the lightweight-article support portion 44 is provided at a position that is located in the insertion space 12 of the heavyweight transport article 6H when the heavyweight-article support portion 45 is inserted in the insertion space 12 of the heavyweight transport article 6H.

That is, by making the width of the lightweight-article support portion 44 in the left-right direction Y larger than the width of the support-target portion 9 of the lightweight transport article 6L in the left-right direction Y, only the lightweight-article support portion 44, out of the lightweight-article support portion 44 and the heavyweight-article support portion 45, can be inserted at the time of insertion of the support member 33 into the insertion space 12 of the lightweight transport article 6L. Therefore, although the insertion space 12 of the lightweight transport article 6L is comparatively narrow in the vertical direction, the support member 33 can be prevented from interfering with the lightweight transport article 6L at the time of insertion of the support member 33 into the insertion space 12 of the lightweight transport article 6L since the lightweight-article support portion 44 is formed to be narrow in the vertical direction.

For example, if the first portion 45a is made equal in length in the left-right direction Y to the second portion 45b, there is a possibility that the first portion 45a of the heavyweight-article support portion 45 may interfere with the edge portion 14 of the lightweight transport article 6L when the lightweight-article support portion 44 supports the lightweight transport article 6L. In consideration of this, in this embodiment, the first portion 45a of the heavyweight-article support portion 45 is made small in length in the left-right direction Y compared with the second portion 45b thereof, to prevent the first portion 45a from interfering with the edge portion 14 of the lightweight transport article 6L when the lightweight-article support portion 44 supports the lightweight transport article 6L.

Control Device and Sensor

Figure 6:
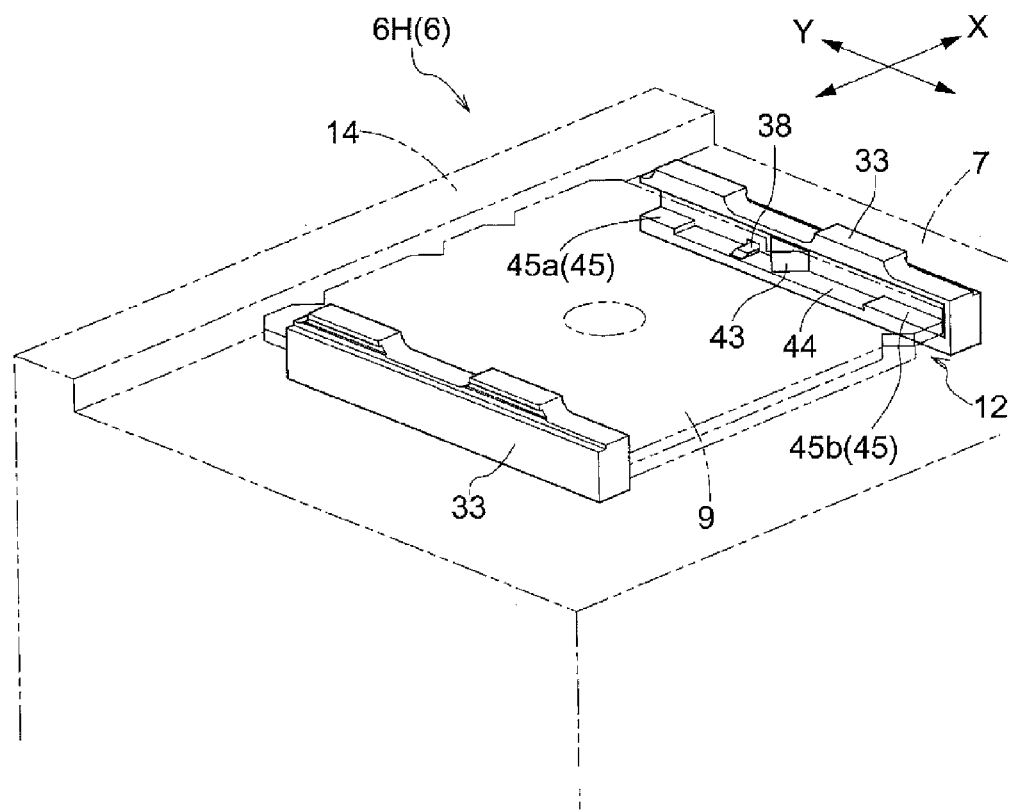
FIG. 6 is a perspective view showing a pair of support members with a heavyweight-article support spacing therebetween.

The ceiling transport vehicle 1 includes: position detection sensors 36 (see FIG. 4) that detect the position of the support members 33; a size detection sensor 37 (see FIG. 3) that detects the size of the transport article 6 lying on the support platform 4; and a presence/absence sensor 38 (see FIGS. 5 and 6) that detects whether or not the support mechanism 23 is supporting the transport article 6.

Also, the ceiling transport vehicle 1 includes a control device H that controls the operations of the motor 19 for traveling, the motor 29 for hoisting, and the motor 35 for spacing switching so as to transport the transport article 6 based on detection information from the position detection sensor 36, the size detection sensor 37, and the presence/absence sensor 38.

Incidentally, the position detection sensor 36 corresponds to the position detection section, and the size detection sensor 37 corresponds to the size detection section.

The control device H functions as the first control section that controls the operation of the motor 35 for spacing switching so as to switch the spacing between the support members 33 among the lightweight-article support spacing, the heavyweight-article support spacing, and the extraction support spacing based on the detection information from the position detection sensor 36, and as the first determination section that determines whether the transport article 6 supported by the support members 33 is the lightweight transport article 6L or the heavyweight transport article 6H based on the detection information from the position detection sensor 36.

The control device H also functions as the second determination section that determines whether the transport article 6 staying at the transfer object position is the lightweight transport article 6L or the heavyweight transport article 6H based on the detection information from the size detection sensor 37, and functions as the second control section that controls, based on the determination information from this second determination section, the operations of the motor 35 for spacing switching and the motor 29 for hoisting so as to support the transport article 6 staying at the transfer object position by the support members 33 and lift the supported transport article 6 to the support height.

As shown in FIG. 4, the position detection sensors 36 include lightweight article position detection sensors 36a, heavyweight article position detection sensors 36b, and retraction position detection sensors 36c.

When the control device H detects the presence of the support members 33 with the lightweight article position detection sensors 36a when the spacing between the support members 33 is being reduced toward the lightweight-article support spacing with the drive of the motor 35 for spacing switching, it then stops the operation of the motor 35 for spacing switching after continuing the operation of the motor 35 for spacing switching to rotate the ball screw 41 by a set amount. In this way, the control device H is configured to control the operation of the motor 35 for spacing switching so as to switch the spacing between the support members 33 to the lightweight-article support spacing.

Likewise, the control device H is configured to control the operation of the motor 35 for spacing switching so as to switch the spacing between the support members 33 to the heavyweight-article support spacing based on the detection information from the heavyweight article position detection sensors 36b, and also configured to control the operation of the motor 35 for spacing switching so as to switch the spacing between the support members 33 to the retraction support spacing based on the detection information from the retraction position detection sensors 36c.

The lightweight article position detection sensors 36a are placed at positions where the presence of the support members 33 can be detected at the time when the support members 33 are being switched to the lightweight-article support spacing. The heavyweight article position detection sensors 36b are placed at positions where the presence of the support members 33 can be detected at the time when the support members 33 are being switched to the heavyweight-article support spacing. The retraction position detection sensors 36c are placed at positions where the presence of the support members 33 is detected at the time when the support members 33 are being switched to the retraction support spacing.

Therefore, the control device H can detect the spacing between the support members 33 based on the detection information from these position detection sensors 36. Also, in the state of supporting the transport article 6, when the support members 33 have been switched to the lightweight-article support spacing and the presence of the support members 33 has been detected with the lightweight article position detection sensors 36a, the control device H can determine that the supported transport article 6 is the lightweight transport article 6L. Also, when the support members 33 have been switched to the heavyweight-article support spacing and the presence of the support members 33 has been detected with the heavyweight article position detection sensors 36b, the control device H can determine that the supported transport article 6 is the heavyweight transport article 6H.

Figure 13:
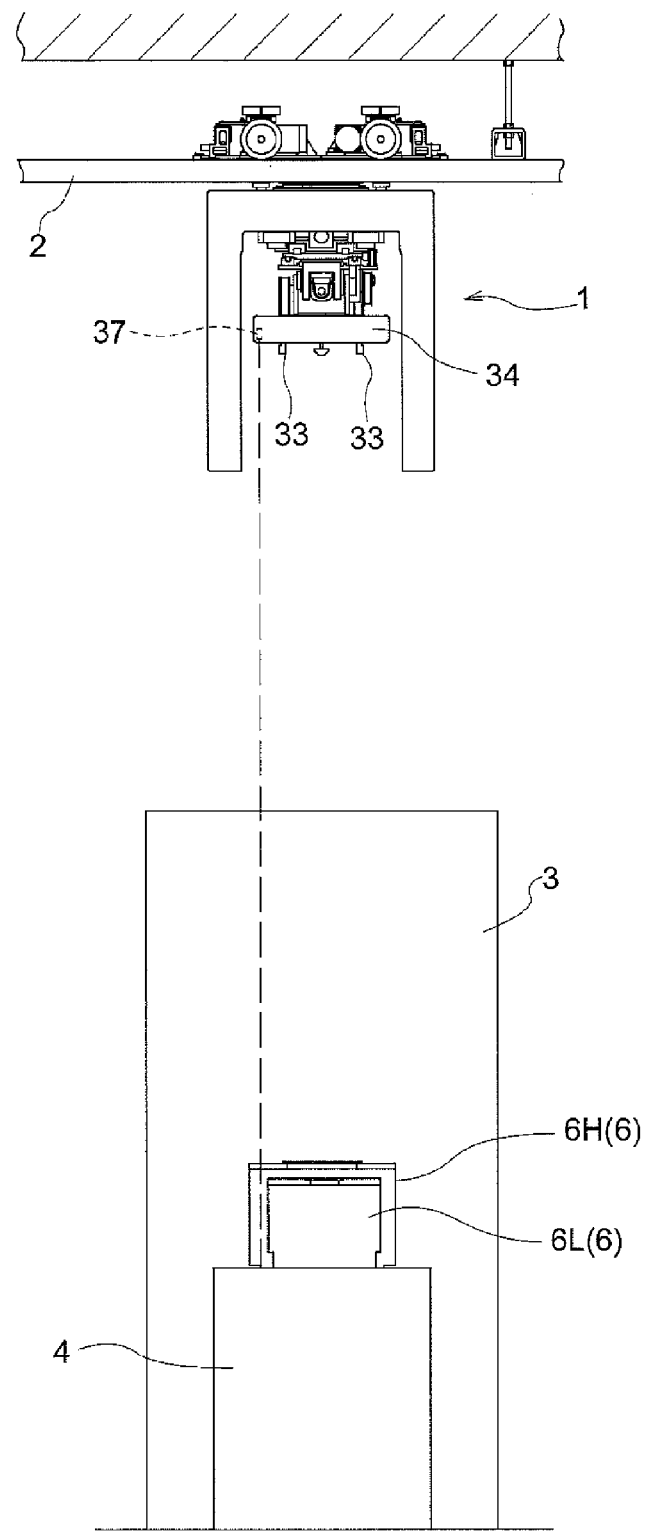
FIG. 13 is a side view showing a size detection sensor.

As shown in FIG. 13, the size detection sensor 37, supported by the hoisting support unit 17, is placed to project detection light directly downward, and constituted by a distance measuring sensor. Also, the size detection sensor 37 is placed at a position where the detection light falls on the transport article 6 when the transport article 6 on the support platform 4 is the heavyweight transport article 6H, and does not fall on the transport article 6 when the transport article 6 on the support platform 4 is the lightweight transport article 6L, in the state where the traveling unit 16 is stopped at a stop position previously set with respect to the support platform 4.

In the state where the traveling unit 16 is stopped at the stop position, the control device H is configured to determine whether the transport article 6 lying on the support platform 4 is the lightweight transport article 6L or the heavyweight transport article 6H based on the detection information from the size detection sensor 37, and control the operations of the motor 35 for spacing switching and the motor 29 for hoisting so as to support the transport article 6 lying on the support platform 4 with the support members 33 and lift the supported transport article 6 to its support height based on the determination information.

Figure 14:
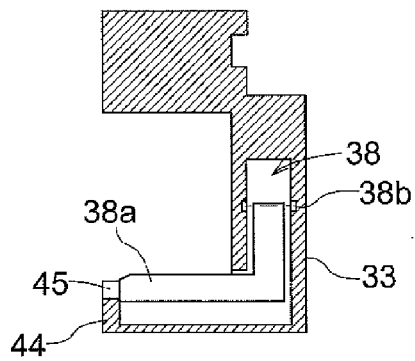
FIG. 14 shows views of a presence/absence sensor.
Figure 14:
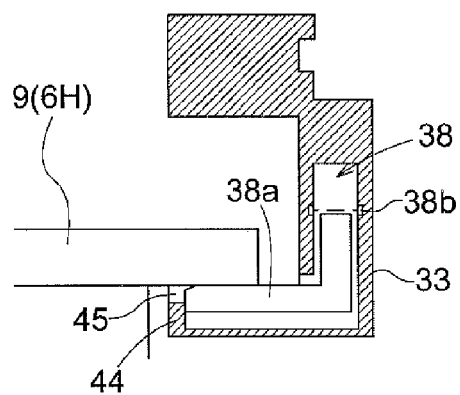
Figure 14:
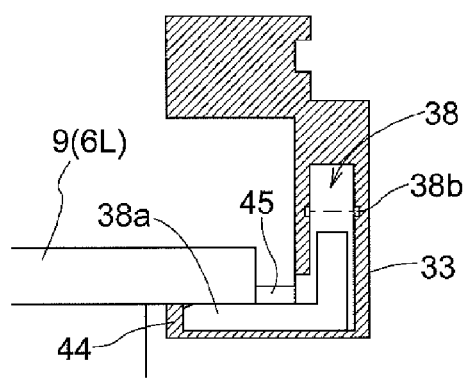
Figure 15:
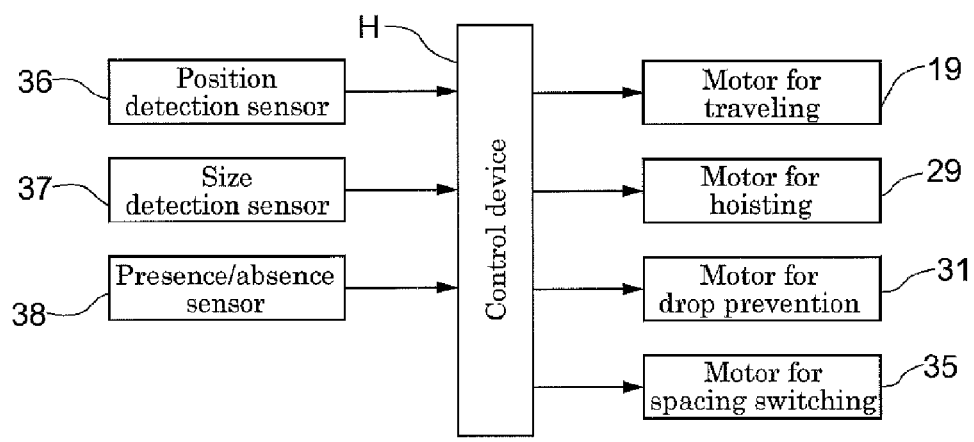
FIG. 15 is a control block diagram.

The presence/absence sensor 38 is provided in one of the pair of support members 33 as shown in FIG. 14, and has an operation portion 38a pressed downward when the support members 33 support the transport article 6. To state more specifically, the presence/absence sensor 38 includes the operation portion 38a pressed downward when supporting the transport article 6 and a detection portion 38b that projects/receives detection light. When the support members 33 do not support the transport article 6, projection of light by the detection portion 38b is blocked by the operation portion 38a. Once the support members 33 support the transport article 6, the operation portion 38a moves downward, whereby the light projection by the detection portion 38b will no more be blocked. Thus, the detection state by the detection portion 38b changes between when the support members 33 are supporting the transport article 6 and when they are supporting no transport article. Therefore, the control device H can determine whether or not the support members 33 are supporting the transport article 6 based on the detection information from the presence/absence sensor 38.

The control device H is configured to execute delivery work that delivers the transport article 6 onto the support platform 4 and receiving work that receives the transport article 6 from the support platform 4.

In the delivery work, first, in the state where the ceiling transport vehicle 1 supporting the transport article 6 is stopped at the stop position corresponding to the support platform 4, the spacing between the drop prevention members 26 is switched to the retraction spacing, and then the belt 24a is let out by a length corresponding to the level difference between the support height and the transfer height (a length shorter when the transport article 6 is the heavyweight transport article 6H than when it is the lightweight transport article 6L). Then, when the transport article 6 is the heavyweight transport article 6H, the spacing between the support members 33 is switched from the heavyweight-article support spacing to the retraction support spacing, to deliver the heavyweight transport article 6H to the support platform 4. When the transport article 6 is the lightweight transport article 6L, the spacing between the support members 33 is switched from the lightweight-article support spacing to the retraction support spacing, to deliver the lightweight transport article 6L to the support platform 4. Thereafter, the belt 24a is wound by the length corresponding to the level difference between the support height and the transfer height. To make the mechanisms operate as described above, the operations of the motor 19 for traveling, the motor 29 for hoisting, the motor 31 for drop prevention, and the motor 35 for spacing switching are controlled by the control device H, to execute the delivery work.

In the receiving work, first, in the state where the ceiling transport vehicle 1 that is not supporting the transport article 6 is stopped at the stop position corresponding to the support platform 4, the belt 24a is let out by a length corresponding to the level difference between the support height and the transfer height (a length shorter when the transport article 6 is the heavyweight transport article 6H than when it is the lightweight transport article 6L). Then, when the transport article 6 is the heavyweight transport article 6H, the spacing between the support members 33 is switched from the retraction support spacing to the heavyweight-article support spacing, to receive the heavyweight transport article 6H from the support platform 4. When the transport article 6 is the lightweight transport article 6L, the spacing between the support members 33 is switched from the retraction support spacing to the lightweight-article support spacing, to receive the lightweight transport article 6L from the support platform 4. Thereafter, the belt 24a is wound by the length corresponding to the level difference between the support height and the transfer height, and then the spacing between the drop prevention members 26 is switched to the catching spacing. To make the mechanisms operate as described above, the operations of the motor 19 for traveling, the motor 29 for hoisting, the motor 31 for drop prevention, and the motor 35 for spacing switching are controlled by the control device H, to execute the receiving work.

The ceiling transport vehicle 1 configured as described above supports the lightweight transport article 6L with the lightweight-article support portion 44 thin in the vertical direction, and supports the heavyweight transport article 6H with the heavyweight-article support portion 45 thick in the vertical direction. These lightweight-article support portion 44 and heavyweight-article support portion 45 are formed integrally, to permit simplification of the configuration.

Other Embodiments (1) While the heavyweight-article support portion 45 and the lightweight-article support portion 44 are lined in the left-right direction Y in the above embodiment, the heavyweight-article support portion 45 and the lightweight-article support portion 44 may be lined in the front-rear direction X so that the lightweight-article support portion 44 is located deeper in the insertion space 12 than the heavyweight-article support portion 45 when the heavyweight-article support portion 45 is inserted into the insertion space 12.

While the heavyweight-article support portion 45 is constituted by the first portion 45a and the second portion 45b with the first portion 45a being short in the left-right direction Y compared with the second portion 45b in the above embodiment, the first portion 45a and the second portion 45b may be the same in length.

(2) While the position detection sensors 36 are provided in the article supporting device, to allow the control device H to determine the size of the transport article 6 supported by the support members 33 in the above embodiment, the following configurations may otherwise be employed.

That is, the size detection sensor 37 may detect the size of the transport article 6 staying at the support height, and the control device H may determine the size of the transport article 6 supported by the support members 33 based on the detection information. Otherwise, as shown in FIG. 14, using the fact that the fall amount of the operation portion 38a of the presence/absence sensor 38 from the position thereof before the support members 33 support the transport article 6 is different between when the support-target portion 9 of the heavyweight transport article 6H is supported and when the support-target portion 9 of the lightweight transport article 6L is supported, the fall amount of the operation portion 38a of the presence/absence sensor 38 observed when the support members 33 supports the transport article 6 may be detected. Based on the detection information, the control device H may determine the size of the transport article 6 that is being supported by the support members 33. Alternatively, the control device H may determine the size of the transport article 6 that is being supported by the support members 33 based on information on the transport article 6 transmitted from a higher-level control section.

(3) While the support members 33 are moved horizontally in the first direction by rotating the ball screw 41 with the drive of the motor 35 for spacing switching in the above embodiment, the support members 33 may be moved horizontally in the first direction with the drive of expansion and contraction of a cylinder. Otherwise, the support members 33 may be swung around a shaft center along the second direction. Like these, the configuration of the drive of the support members 33 can be changed appropriately.

(4) While the article supporting device is provided in the ceiling transport vehicle in the above embodiment, the article supporting device may be provided in other transport devices such as a stacker crane or a floor transport vehicle, or otherwise may be provided in a transfer robot placed on the floor.

The invention claimed is:
1. An article supporting device comprising:
 a support section for supporting a support-target portion provided in a top end portion of a support object; and
 a pair of support members that are provided in the support section and support both end portions of the support-target portion in a first direction along the horizontal direction from below, wherein the pair of support members are configured to be movable close to and away from each other in the first direction, the support object has an insertion space, below the support-target portion, into which the pair of support members are insertable by the movement of the pair of support members close to each other, the support object comprises either a lightweight article or a heavyweight article heavier than the lightweight article, wherein the insertion space of the lightweight article is formed to be narrow in the vertical direction compared with the insertion space of the heavyweight article, each of the pair of support members includes a lightweight-article support portion that is insertable into the insertion space of the lightweight article and supports the support-target portion of the lightweight article from below and a heavyweight-article support portion that is insertable into the insertion space of the heavyweight article and supports the support-target portion of the heavyweight article from below, the heavyweight-article support portion is formed to be thick in the vertical direction compared with the lightweight-article support portion, and the lightweight-article support portion is provided at a position that is located in the insertion space of the heavyweight article when the heavyweight-article support portion is inserted into the insertion space of the heavyweight article, and formed integrally with the heavyweight-article support portion.

2. The article supporting device of claim 1, wherein
the support-target portion of the heavyweight article is formed to be wide in a second direction perpendicular to the first direction as viewed from top compared with the support-target portion of the lightweight article, and
the heavyweight-article support portion is constituted by a first portion located on a first side that is one side in the second direction with respect to the lightweight-article support portion and a second portion located on a second side that is the other side in the second direction with respect to the lightweight-article support portion, the first portion and the second portion being lined in the second direction.

3. The article supporting device of claim 2, wherein
each of the pair of support members includes a plate-like body having a top surface on which a downwardly recessed portion is formed in an intermediate portion in the second direction, and
the lightweight-article support portion is formed of the recessed portion, and the first portion and the second portion are formed of portions located on both sides of the recessed portion in the second direction.

4. The article supporting device of claim 2, wherein
the lightweight article includes a protrusion located on the first side in the second direction with respect to the support-target portion of the lightweight article,
the protrusion is formed so that a top end is located above a bottom end of the insertion space of the lightweight article, and the first portion is formed to be short in the second direction compared with the second portion, and
the first portion is located closer to the second side in the second direction than the protrusion is in the state where the support-target portion of the lightweight article is supported by the lightweight-article support portion.

5. The article supporting device of claim 1, wherein
the support-target portion of the heavyweight article is formed to be wide in the first direction compared with the support-target portion of the lightweight article, the device further comprises a first spacing switching drive section that moves the pair of support members close to and away from each other horizontally in the first direction to switch the spacing between the pair of support members in the first direction, and the first spacing switching drive section is configured to be able to switch the spacing between the pair of support members in the first direction among a lightweight-article support spacing that is narrower than the width of the support-target portion of the lightweight article in the first direction, a heavyweight-article support spacing that is wider than the lightweight-article support spacing and narrower than the width of the support-target portion of the heavyweight article in the first direction, and a retraction support spacing that is a spacing wider than the width of the support-target portion of the heavyweight article in the first direction.

6. The article supporting device of claim 5, further comprising:
a position detection section that detects the position of the pair of support members;
a first control section that controls the operation of the first spacing switching drive section so as to switch the spacing between the pair of support members among the lightweight-article support spacing, the heavyweight-article support spacing, and the retraction support spacing based on detection information from the position detection section; and
a first determination section that determines whether the support object supported by the pair of support members is the lightweight article or the heavyweight article based on the detection information from the position detection section.

7. The article supporting device of claim 1, wherein
the heavyweight article is formed to be large in contour compared with the lightweight article,
the support section is supported by a movable body that moves along a movement path, and
the device further comprises:
a hoisting drive section that lifts and lowers the pair of support members between a lifted height where the pair of support members support the support object staying at a support height and a lowered height that is lower than the support height and the same as the height of the insertion space of the support object staying at a transfer object position;
a size detection section that detects the size of the support object staying at the transfer object position;
a second spacing switching drive section that moves the pair of support members close to and away from each other in the first direction;
a second determination section that determines whether the support object staying at the transfer object position is the lightweight article or the heavyweight article based on detection information from the size detection section; and
a second control section that controls the operations of the second spacing switching drive section and the hoisting drive section so as to support the support object staying at the transfer object position with the pair of support members and lift the supported support object up to the support height based on determination information from the second determination section.

* * * * *